(12) United States Patent
Sievert et al.

(10) Patent No.: US 9,407,245 B2
(45) Date of Patent: Aug. 2, 2016

(54) SYSTEM FOR DIGITALLY CONTROLLED EDGE INTERPOLATOR LINEARIZATION

(71) Applicant: Intel IP Corporation, Santa Clara, CA (US)

(72) Inventors: Sebastian Sievert, Munich (DE); Assaf Ben-Bassat, Haifa (IL); Ofir Degani, Haifa (IL); Rotem Banin, Even-Yehuda (IL)

(73) Assignee: Intel IP Corporation, Santa Clara, CA (US)

( * ) Notice: Subject to any disclaimer, the term of this patent is extended or adjusted under 35 U.S.C. 154(b) by 44 days.

(21) Appl. No.: 14/318,857

(22) Filed: Jun. 30, 2014

(65) Prior Publication Data

US 2015/0381156 A1   Dec. 31, 2015

(51) Int. Cl.
    *H03K 3/027*      (2006.01)
    *H03L 7/06*      (2006.01)
    *H03K 5/1252*      (2006.01)
    *H03L 7/099*      (2006.01)
    *H03L 7/081*      (2006.01)

(52) U.S. Cl.
    CPC ............ *H03K 5/1252* (2013.01); *H03L 7/0995* (2013.01); *H03L 7/0998* (2013.01); *H03L 7/081* (2013.01); *H03L 7/0814* (2013.01)

(58) Field of Classification Search
    CPC .......... H04L 7/02; H03H 11/20; H03L 7/018; H03L 7/0814; H03L 7/0998; H03L 7/0995
    USPC ........... 327/237, 276, 231, 152–15, 258, 115; 375/355, 371–376
    See application file for complete search history.

(56) References Cited

U.S. PATENT DOCUMENTS

| | | | |
|---|---|---|---|
| 6,727,741 B2 | 4/2004 | Huang | |
| 7,659,763 B2 * | 2/2010 | Camara | ..................... G06F 1/04 327/108 |
| 2009/0102523 A1 * | 4/2009 | Kim | ...................... H03L 7/0814 327/149 |
| 2011/0050312 A1 * | 3/2011 | Fujino | ...................... H03K 5/13 327/237 |
| 2011/0241746 A1 * | 10/2011 | Fu | ........................ H03H 11/265 327/276 |

* cited by examiner

*Primary Examiner* — Dinh T Le
(74) *Attorney, Agent, or Firm* — Schwegman Lundberg & Woessner, P.A.

(57) ABSTRACT

This application discusses, among other things, an interpolator architecture for digital-to-time converters (DTCs). In an example, an interpolator can include interpolation cells and retention cells configured provide an interpolated output based on at least two offset clock signals. In certain examples, an example interpolator can provide contention free control of the interpolator output with improved noise immunity.

19 Claims, 2 Drawing Sheets

SYSTEM FOR DIGITALLY CONTROLLED EDGE INTERPOLATOR LINEARIZATION

BACKGROUND

Digital-to-time converters (DTC) are planned to be introduced in cellular radio circuits. DTCs can simplify radio architectures for wideband LTE (LTE-A), multiple-input multiple-output (MIMO) uplink, inter-band and non-contiguous intra-band carrier aggregation by eliminating the need for a local oscillator for each transmission and reception frequency. DTCs can often include multiple stages to provide a desired frequency or desired phase modulation. Some stages can include an interpolator circuit to provide an output phase signal based on temporally offset signals generated by upstream stages of the DTC. Simple interpolator circuits can exhibit nonlinear behaviour, a portion of which can be attributed to contention between inverters of the simple interpolator circuits. Contention free interpolator circuits have been discussed but can suffer from, among other things, high complexity or susceptibility to noise.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Digital polar transmitter (DPTX) architectures are very attractive for modern radios, because such architectures can provide improved area and power consumption characteristics compared with conventional analog architectures. A DTC is a component in certain examples of DPTX which can modulate a local oscillator carrier with phase information for a transmission signal. Example DTC architectures according to the present subject matter can be segmented into a coarse phase modulation segment and a fine phase modulation segment. Other example DTC architectures can include a static divider with multiplexer phase-selection or a multi-modulus divider for coarse phase segment. In certain examples, fine granularity control of the DTC can include a digitally controlled edge interpolator (DCEI) topology. However, relatively large integral non-linearity (INL) compared to the dynamic range (DR) (peak INL/DR ~15%) can be characteristic of DCEI topology. A source of the non-linearity can relate to contention conditions that evolve in the DCEI topology. A new, contention-free DCEI topology has been discussed that proposes to remove the contention conditions, while maintaining the interpolation behavior, thus providing an improved linear response. However, the new topology has a number of drawbacks including elaborate circuitry, techniques that negatively impact the dynamic range and conditions that leave the outputs floating. The elaborate circuitry results in increased power consumption. The negative impact on the dynamic range shrinks the dynamic range of the interpolation function. The conditions that leave the outputs of the interpolator floating make the system more susceptible to noise or interference.

Figure 1:
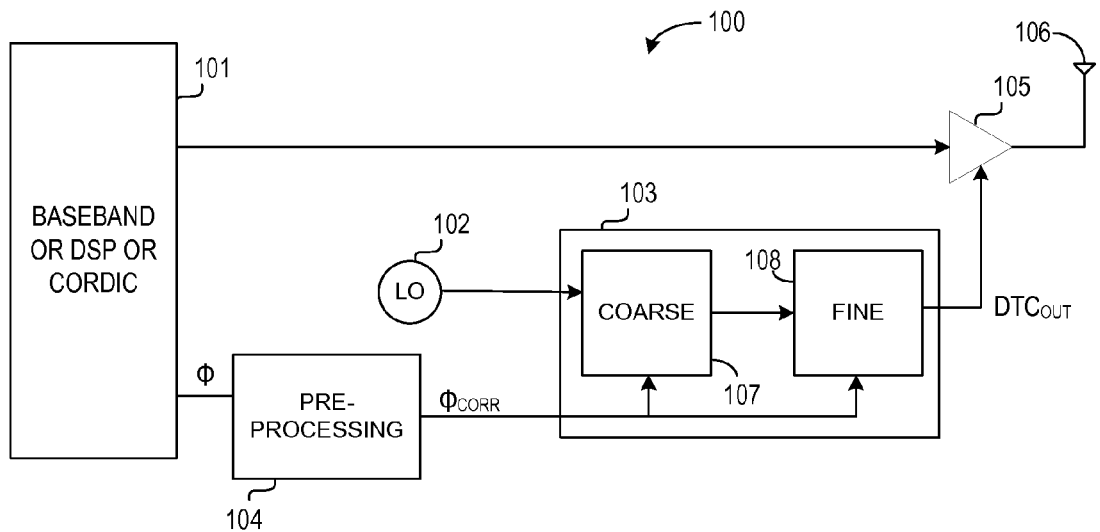
FIG. 1 illustrates generally a DTC-based architecture.

FIG. 1 illustrates generally a DTC-based architecture 100. The illustrated architecture is shown for an example transmitter, however, DTCs can be employed in a receivers to provide a desired receiver frequency reference. In certain examples, the architecture 100 can include a processor 101, a local oscillator 102, DTC 103, a pre-processor 104 for the DTC 103, an power amplifier 105 and an antenna 106. In certain examples, the processor 101 can include a baseband processor such as for a mobile electronic device, a digital signal processor (DSP) or a CORDIC converter for providing amplitude and phase modulation information representative of digital transmission data. In certain examples, some known non-linearity of the DTC 103 can be compensated by using the pre-processor 104 for the DTC 103 such that the pre-processor 104 receives phase modulation information ($\Phi$) from the processor and provides corrected phase modulation information ($\Phi_{CORR}$) to the DTC 103. The DTC 103 can receive reference clock information from the local oscillator 102 and the phase modulation information ($\Phi$) from the processor 101 or corrected phase modulation information ($\Phi_{CORR}$) from the pre-processor 104. The DTC 103 can provide a phase modulated signal ($DTC_{OUT}$) at a desired frequency using the local oscillator 102 and the phase modulation information ($\Phi$) or the corrected phase modulation information ($\Phi_{CORR}$). The power amplifier 105 can mix the phase modulated signal ($DTC_{OUT}$) with amplitude information to provide a transmission signal. The antenna 106 can broadcast the transmission signal for reception by a second device. In certain examples, such as for MIMO systems, additional DTCs can use the same local oscillator to provide additional channel frequencies. In certain examples, the DTC 103 can be segmented into stages 107, 108 that sequentially provide finer and finer phase delays. In certain examples, DTCs can be implemented as a cascade of coarse and fine stages to minimize power dissipation. The present examples discuss a two stage DTC 103 having a coarse stage 107 and a fine stage 108, however, it is understood that DTCs can include additional stages without departing from the scope of the present subject matter.

In certain examples, the coarse stage 107 can be responsive to a first number of bits of the corrected phase modulation information ($\Phi_{CORR}$), typically the most significant bits, and the fine stage 108 can be responsive to a second number of bits of the corrected phase modulation information ($\Phi_{CORR}$), typically, the remaining bits. The fine stage 108 can provide finer delay steps based on each coarse delay interval. In certain examples, the fine stage 108 can provide minimal delay steps for phase modulation on the order of less than 1 picosecond. In certain examples, the fine stage 108 can be implemented using an edge interpolator where incremental delay between a first coarse stage output and a second coarse stage output, delayed with respect to the first coarse stage output, can be changed according to the second number of bits of the phase modulation information.

Figure 2:
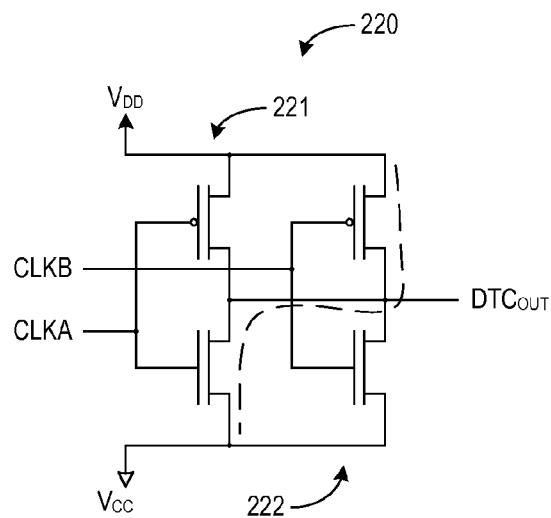
FIG. 2 illustrates an individual interpolation cell that can be part of a fine stage edge interpolator.

The present inventors have recognized an interpolation solution that provides contention free, full dynamic range ($2\pi$) interpolation using simple circuitry while maintaining continuous control of the interpolator outputs. FIG. 2 illustrates an individual interpolation cell 220 that can be part of an edge interpolator. The cell can include a first inverter 221 coupled to a first clock signal (CLKA) and a second inverter 222 coupled to a second clock signal (CLKB). In certain multi-cell interpolators, selection logic can select to enable one of the first or the second inverters 221, 222 for each clock cycle, such that if the first clock signal (CLKA) precedes the second clock signal (CLKB), enabling all of the first inverters 221 of each cell can provide a minimum interpolation delay and enabling all the second inverters 222 of each cell can provide a maximum interpolation delay. For delays between the minimum and maximum delay, a certain number of first inverters 221 can be enabled along with a certain number of second inverters 222. During the interpolation period between reception of a transition of the first clock signal (CLKA) and the reception of an immediately subsequent delayed transition of the second clock signal (CLKB), the first inverters 221 can be in contention with the second inverters 222. The single cell interpolator of FIG. 2 illustrates that during the interpolation period a low impedance path for two or more cells can be formed between the supply rails ($V_{DD}$, $V_{CC}$) of the interpolator via the pull-up transistor of a second inverter of a first cell and the pull down transistor of the first inverter of a different cell for transitions of the first and second clock where the logic level of the first clock signal and the logic level of the second clock signal are not equal. Typically, a single interpolation cell does not present a contention issue as illustrated. More commonly, the first inverter 221 is located on first interpolator cell of a multi-cell interpolator and the second inverter 222 is located on a second interpolator cell of the multi-cell interpolator and the contention appears as illustrated from the outputs of each interpolator cell being coupled. For multi-cell interpolators in which the output of the interpolator is coupled to the output of each interpolation cell, the nonlinearity caused by contention between cells can be manifest by slightly different incremental delays between the minimum delay and the maximum delay of the multi-cell interpolator.

Figure 3:
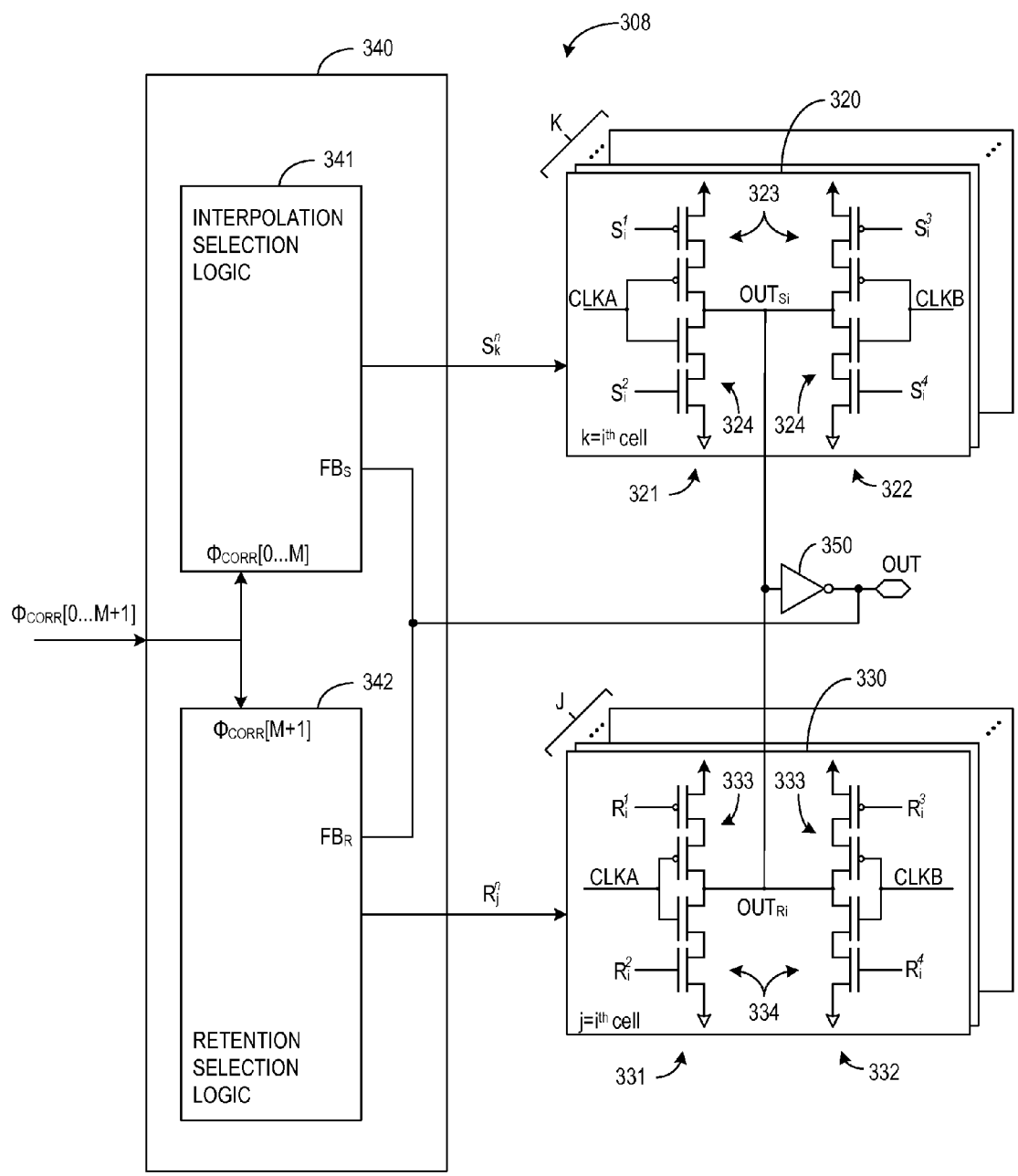
FIG. 3 illustrates generally an example multi-cell interpolator that removes contention between interpolator cells, provides improved linearity and reduces noise susceptibility of the interpolator.

FIG. 3 illustrates generally an example multi-cell interpolator 308 that removes contention between interpolator cells and provides improved linearity using straight forward circuitry and control logic. In certain examples, a multi-cell interpolator 308 can include a number (K) of interpolation cells 320, a number (J) of retention cells 330, and control logic 340 including interpolation cell selection logic 341 and retention cell selection logic 342. In some examples, the number of interpolation cells can be same as the number of retention cells. In some examples, each interpolation cell 320 and each retention cell 330 can include a first inverter 321, 331, a second inverter 322, 332, and a cell output $OUT_{Si}$, $OUT_{Ri}$, coupled to the first inverter 321, 331, and the second inverter 322, 332, and an output (OUT) of the multi-cell interpolator. In some examples, an inverter 350 can couple the cell outputs ($OUT_{Si}$, $OUT_{Ri}$) with the output (OUT) of the multi-cell interpolator 308. In certain examples, each inverter 321, 322, 331, 332 can be coupled to either a first input clock signal (CLKA) or a second input clock signal (CLKB). In certain examples, the first and second input clock signals (CLKA, CLKB) can be temporally offset from each other. In some examples, a coarse stage of a DTC can provide the first and second clock signals (CLKA, CLKB) and the offset can represent an incremental coarse delay of the coarse stage of the DTC. In certain examples, each inverter 321, 322, 331, 332 of each cell 320, 330 can include a pull-up section 323, 333 and a pull down section 324, 334. In some examples, the control gates of a transistor in each section of each first inverter 321, 331 can be coupled to the first clock signal (CLKA) and the control gates of a transistor in each section of each second inverter 322, 332 can be coupled to the second clock signal (CLKB). In some examples, the control gates of a transistor in each section of each first inverter 321, 331 can be directly coupled to the first clock signal (CLKA) and the control gates of a transistor in each section of each second inverter 322, 332 can be directly coupled to the second clock signal (CLKB).

In certain examples, each section of an inverter can include a selection transistor having a gate configured to receive a selection signal ($S_n^i$, $R_n^i$) from either the interpolation cell selection logic 341 or the retention cell selection logic 342 of the control logic 340. In certain examples, the control logic 340 for the interpolator can receive interpolation information from device processor such as a processor for a mobile electronic device. The control logic 340 can pass the interpolation information to the interpolation cell selection logic 341 and the retention cell selection logic 342. In general, the interpolation cell selection logic 341 and the retention cell selection logic 342 can control the selection and de-selection of each section of each inverter in each corresponding interpolation or retention cell 320, 330.

In certain examples, the interpolation cell selection logic 341 and the retention cell selection logic 342 can receive a feedback signal ($FB_S$, $FB_R$) from the output of the interpolator in addition to the modulation information, such as the corrected modulation information ($\Phi_{CORR}$ [0 ... M]) for the fine stage of the DTC, where M can be related to the resolution of the fine stage of the DTC, such as the number of bits of resolution of the fine stage of the DTC. The feedback signals ($FB_S$, $FB_R$) can allow the interpolation cell selection logic 341 to disable certain stages of each interpolation cell 320 to prevent contention during an isolation period when the first and second clock signals (CLKA, CLKB) are at different logic levels. Referring again to FIG. 3, an interpolation cell 320 can include first and second inverters 321, 322. Each interpolation cell inverter can include a clock signal pull-up transistor, clock signal pull-down transistor, a selection pull-up transistor and a selection pull-down transistor. In certain examples, the clock signal pull-up transistor and the clock signal pull-down transistor can be directly responsive to a state of the clock signal coupled to the control node of the clock signal transistors. The pull-up and pull-down selection transistors can be responsive to a set of selection signals ($S_k^n$) received from the interpolation cell selection logic 341, where n=1, 2, 3, or 4 and k can range from 1 to the number of interpolation cells 320 for the illustrated example of FIG. 3. In certain examples, each interpolator selection signal ($S_i^n$) can be responsive to a state of the output (OUT) of the interpolator such that for a particular interpolator cell (i) the selection signals ($S_i^n$) for a particular interpolation cell can be given by:

$(S_i^1) = \overline{Sel_i} + \overline{OUT}$, $(S_i^2) = Sel_i \cdot \overline{OUT}$, $(S_i^3) = Sel_i + \overline{OUT}$, and $(S_i^4) = \overline{Sel_i} \cdot \overline{OUT}$.

Where OUT can represent the output of the interpolator and $Sel_i$ can be representative of phase modulation information received from the processor and associated with the particular interpolation cell 320. In certain examples, Sel can include multi-bit phase modulation command information representative of phase modulation information received from the processor and $Sel_N$ can be the fine phase modulation command information, where N can represent the number of bits of resolution for the fine modulation as well as the number of interpolation cells associated with the fine modulation stage of the DTC. In certain examples, the phase modulation command information (Sel) can be provided by the selection logic using information received from a pre-processor. In certain examples, the pre-processor can receive raw phase modulation information from the processor and can process the raw phase modulation information with calibration information associated with non-linearity of the DTC such that the phase modulation command information (Sel) includes a representation of the corrected phase modulation information ($\Phi_{CORR}$) received at the DTC. For the above illustrated example, when $Sel_i$ is high, the interpolation cell can be responsive to the first clock signal and upon transition of the output (OUT) of the interpolator, the output of the interpolator cell can float. Although the interpolation cell selection logic 341 can eliminate contention between inverters of each of the interpolation cells 320, the floating output of the interpolation cells 320 including the floating output (OUT) of the interpolator can be susceptible to noise and interference.

The inventors have recognized that if the relative delay between the first clock signal and the second clock signal can be determined, at least a portion of the interpolation cells can maintain a defined state of the interpolator output (OUT). In certain examples, a least significant bit of the interpolation command information for a prior DTC stage, for example $\Phi_{CORR}[M+1]$, can provide a feed-forward indication of the relative delay between the first and second clock signals (CLKA, CLKB), thus, the interpolator cell selection logic could provide the following interpolation cell selection signals to remove contention during the interpolation interval and retain the state of the output of each cell outside the interpolation interval, $(S_i^1) = \overline{Sel_i} + b_{M+1} \cdot \overline{OUT}$, $(S_i^2) = Sel_i \cdot (\overline{b_{M+1}} + \overline{OUT})$, $(S_i^3) = Sel_i + \overline{b_{M+1}} \cdot \overline{OUT}$, and $(S_i^4) = \overline{Sel_i} \cdot (b_{M+1} + \overline{OUT})$, where, in certain examples, $b_{M+1}$ can be representative of the least significant bit of the interpolation command information for a prior DTC stage. However, the above design using only interpolation cells can be sensitive to charge sharing between the select transistor sources and the output, which can create a code dependent charge sharing and a related nonlinearity.

To alleviate identified related non-linearity, the inventors have recognized that retention cells corresponding in design to the interpolation cells can be used to maintain the output (OUT) of the interpolator 308 between interpolation intervals. In certain examples, the retention cells 330 can be responsive to retention cell selection signals ($R_j^n$) provided by the retention cell selection logic 342 and can hold the output ($OUT_{Si}$) of a corresponding interpolation cell 320 in a defined state in between interpolation intervals. Referring again to FIG. 3, a retention cell 330 can include first and second inverters 331, 332. Each retention cell inverter can include a clock signal pull-up transistor, clock signal pull-down transistor, a selection pull-up transistor, and a selection pull-down transistor. In certain examples, the clock signal pull-up transistor and the clock signal pull-down transistor can be directly responsive to a state of the clock signal (CLKA, CLKB) coupled to each transistors' control node. The pull-up and pull-down selection transistors can be responsive to a set of selection signals ($R_j^n$) received from the retention cell selection logic 342, where n=1, 2, 3, or 4 and j can range from 1 to the number of retention cells 330 for the illustrated example of FIG. 3. In certain examples, each of the retention cells can receive the same signal values from the retention cell selection logic 342. In certain examples, each retention cell selection signal ($R_i^n$) can be responsive to a representation ($b_{M+1}$) of a state of the least significant bit $\Phi_{CORR}[M+1]$ of the preceding coarse delay of the DTC such that for a particular retention cell (i), the retention cell selection signals can be given by:

$(R_i^1) = b_{M+1} + OUT$, $(R_i^2) = \overline{b_{M+1}} \cdot OUT$, $(R_i^3) = \overline{b_{M+1}} + OUT$, and $(R_i^4) = b_{M+1} \cdot OUT$ Where OUT can be representative of the output of the interpolator, and $b_{(M+1)}$ is the representation of the state of the least significant bit of the coarse delay of the DTC and can be representative of a portion of the corrected interpolation information ($\Phi_{CORR}[M+1]$), for example. In certain examples, $b_{M+1}$ can provide an indication of which of the first or second clock signals (CLKA, CLKB) leads or lags the other.

Additional Notes

In Example 1, an interpolator can include a first interpolator cell and selection logic. The first interpolator cell can include a first inverter responsive to a first transition of a first input signal, a second inverter responsive to a first transition of a second input signal, wherein the first transition of the second input signal is delayed from the first transition of the first signal in a first state of a lag condition of the first and second input signals, and a first interpolator cell output coupled to an output of the first inverter and an output of the second inverter, the first interpolator output configured to provide an output signal interpolated from the first input signal and the second input signal. The first selection logic can be configured to enable a first transistor circuit of the first inverter in response to the first transition of the first input signal, to enable a first transistor circuit of the second inverter in response to the first transition of the second input signal, and to disable the first transistor circuit of the first inverter and the first transistor circuit of the second inverter prior to a subsequent transition of either the first input signal or the second input signal to prevent contention between the first inverter and the second inverter.

In Example 2, the first selection logic of Example 1 optionally is configured to disable the first transistor circuit of the first inverter after the first transition of the second input signal and prior to a subsequent transition of either the first input signal or the second input signal to prevent contention between the first inverter and the second inverter.

In Example 3, each inverter of the first and second inverters of any one or more of Examples 1-2 optionally includes a pull-up transistor circuit including first and second pull-up transistors coupled in series, wherein the first pull-up transistor is configured to receive the corresponding input signal of the first and second input signals and the second pull-up transistor is configured to receive a first selection signal and a third selection signal from a plurality of selection signals provided by the first selection logic, and a pull-down transistor circuit including first and second pull-down transistors coupled in series, wherein the first pull-down transistor is configured to receive the corresponding input signal of the first and second input signals and the second pull-down transistor is configured to receive a second selection signal or a fourth selection signal from the plurality of selection signals provided by the first selection logic.

In Example 4, the selection logic of any one or more of Examples 1-3 optionally is configured to receive interpolation command information ($Sel_1$) for the first interpolation cell and feedback information including a state of the first interpolator cell output (OUT), and to provide the plurality of selection signals ($S_1^n$). The plurality of selection signals can include the first selection signal ($S_1^1$), the second selection signal ($S_1^2$), the third selection signal ($S_1^3$), and the fourth selection signal ($S_1^4$). Each state of the plurality of selection signals can be given by:

$$(S_i^1) = \overline{Sel_i} + \overline{OUT},$$

$$(S_i^2) = Sel_i \cdot \overline{OUT},$$

$$(S_i^3) = Sel_i + \overline{OUT}, \text{ and}$$

$$(S_i^4) = \overline{Sel_i} \cdot \overline{OUT}.$$

In Example 5, the interpolator of any one or more of Examples 1-4 optionally includes a first retention cell configured to retain a state of the first interpolator cell output in between the first transition of the second input signal and an immediately subsequent transition of either the first input signal or the second input signal.

In Example 6, the interpolator of any one or more of Examples 1-5 optionally includes second selection logic configured to disable the first retention cell in response to the first transition of the first input signal and to enable the first retention cell after the first transition of the second input signal.

In Example 7, the second selection logic of any one or more of Examples 1-6 optionally is configured to receive an indication of the lag condition of the first and second input signals and to enable the first retention cell after the first transition of the second input signal using the indication.

In Example 8, the first retention cell of any one or more of Examples 1-7 optionally includes a third inverter responsive to a state of the first input signal, and a fourth inverter responsive to a state of the second input signal.

In Example 9, the second selection logic of any one or more of Examples 1-8 optionally is configured to receive an indication of the lag condition of the first and second input signals and to provide retention control signals to the third and fourth inverters of the first retention cell.

In Example 10, each inverter of the third and fourth inverters of any one or more of Examples 1-9 optionally includes a pull-up transistor circuit including first and second pull-up transistors coupled in series, wherein the first pull-up transistor is configured to receive the corresponding input signal of the first and second input signals and the second pull-up transistor is configured to receive a first retention selection signal and a third retention selection signal from a plurality of retention selection signals provided by the second selection logic, and a pull-down transistor circuit including first and second pull-down transistors coupled in series, wherein the first pull-down transistor is configured to receive the corresponding input signal of the first and second input signals and the second pull-down transistor is configured to receive a second retention selection signal or a fourth retention selection signal from the plurality of retention selection signals provided by the second selection logic.

In Example 11, the second selection logic of any one or more of Examples 1-10 optionally is configured to receive feed-forward interpolation information ($b_{M+1}$) indicative of the lag condition of the first and second input signals and feedback information including a state of the first interpolator cell output (OUT), and to provide the plurality of retention selection signals ($R_1^n$) including the first retention selection signal ($R_1^1$), the second retention selection signal ($R_1^2$), the third retention selection signal ($R_1^3$), and the fourth retention selection signal ($R_1^4$). Each state of the plurality of retention selection signals can be given by:

$$(R_i^1) = b_{M+1} + OUT,$$

$$(R_i^2) = \overline{b_{M+1}} \cdot OUT,$$

$$(R_i^3) = \overline{b_{M+1}} + OUT, \text{ and}$$

$$(R_i^4) = b_{M+1} \cdot OUT, \text{ and}$$

wherein $b_{M+1}$ can be representative of a control bit of a delay stage preceding the interpolator.

In Example 12, a method of interpolating a first input signal and a second input signal to provide an interpolated output signal at an output of an interpolator can include receiving a first transition of the first input signal at a first inverter of a first interpolation cell of the interpolator, receiving a first transition of the second input signal at a second inverter of the first interpolation cell, wherein the first transition of the second input signal is delayed from the first transition of the first input signal in a first state of a lag condition of the first and second input signals, receiving a plurality of selection signals at control nodes of the first and second inverters from a first selection logic, and providing an interpolated signal at an output of the interpolator using the selection signals, an output of the first inverter, and an output of the second inverter. Providing the interpolated signal can include enabling a first portion of the first inverter in response to the first transition of the first input signal using the plurality of selection signals, the output of first inverter coupled to an output of the first interpolator cell, enabling a first portion of a second inverter in response to the first transition of the second input signal using the plurality of selection signals, the output of the second inverter coupled to the output of the first interpolator cell, and disabling the first portion of the second inverter a delay interval after receiving the first transition of the second input signal using the plurality of selection signals to prevent contention between the first inverter and the second inverter. The output of the first interpolator cell can be coupled to the output of the interpolator.

In Example 13, the method of any one or more of Examples 1-11 optionally includes disabling the first transistor circuit of the first inverter after the first transition of the second input signal and prior to a subsequent transition of the first input signal using the plurality of selection signals.

In Example 14, the method of any one or more of Examples 1-3 optionally includes proving the plurality of selection signals from the first selection logic, wherein the providing the plurality of selection signals can include receiving interpolation command information ($Sel_1$) for the first interpolation cell at the first selection logic, and receiving a state of the output (OUT) of the interpolator at the first selection logic.

In Example 15, the providing the plurality of selection signals of any one or more of Examples 1-14 optionally includes providing a first selection signal ($S_1^1$) of the plurality of selection signals, wherein a state of the first selection signal can be given by $(S_i^1) = \overline{Sel_i} + \overline{OUT}$, providing a second selection signal ($S_1^2$) of the plurality of selection signals, wherein a state of the first selection signal can be given by $(S_i^2) = Sel_i \cdot \overline{OUT}$, providing a third selection signal ($S_1^3$) of the plurality of selection signals, wherein a state of the third selection signal can be given by $(S_i^3) = Sel_i + \overline{OUT}$, and providing a fourth selection signal ($S_1^4$) of the plurality of selection signals, wherein a state of the fourth selection signal can be given by $(S_i^4) = \overline{Sel_i} \cdot \overline{OUT}$.

In Example 16, the method of any one or more of Examples 1-15 optionally includes retaining a state of the output of the first interpolator cell during an interval in between the first transition of the second input signal and an immediately subsequent transition of either the first input signal or the second input signal using an output of a first retention cell of the interpolator and a plurality of retention selection signals provided by second selection logic.

In Example 17, the method of any one or more of Examples 1-16 optionally includes disabling the first retention cell in response to the first transition of the first input signal using the second selection logic, and enabling the first retention cell after the first transition of the second input signal using the second selection logic.

In Example 18, the enabling the first retention cell of any one or more of Examples 1-17 optionally includes receiving feed-forward interpolation information ($b_{M+1}$) indicative of the lag condition of the first and second input signals at the second logic, receiving feedback information including a state of the first interpolator output (OUT), and providing the plurality of retention selection signals ($R_1''$) to the first retention cell.

In Example 19, the providing the plurality of retention selection signals ($R_1''$) of any one or more of Examples 1-18 optionally includes providing a first retention selection signal ($R_1^1$) to a first control node of a third inverter of the retention cell, wherein a state of the first retention signal can be given by: $(R_1^1) = b_{M+1} + \text{OUT}$, providing a second retention selection signal ($R_1^2$) to a second control node of the third inverter of the retention cell, wherein a state of the second retention signal can be given by: $(R_1^2) = \overline{b_{M+1}} \cdot \text{OUT}$, providing a third retention selection signal ($R_1^3$) to a first control node of a fourth inverter of the retention cell, wherein a state of the third retention signal can be given by: $(R_1^3) = \overline{b_{M+1}} + \text{OUT}$, providing a fourth retention selection signal ($R_1^4$) to a second control node of the fourth inverter of the retention cell, wherein a state of the fourth retention signal is given by: $(R_1^4) = b_{M+1} \cdot \text{OUT}$, and wherein $b_{M+1}$ can be representative of a control bit of a delay stage preceding the interpolator.

Example 20 can include, or can optionally be combined with any portion or combination of any portions of any one or more of Examples 1 through 19 to include, subject matter that can include means for performing any one or more of the functions of Examples 1 through 19, or a machine-readable medium including instructions that, when performed by a machine, cause the machine to perform any one or more of the functions of Examples 1 through 19.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An interpolator comprising:
   a first interpolator cell, the first interpolator cell comprising:
      a first inverter responsive to a first transition of a first input signal;
      a second inverter responsive to a first transition of a second input signal, wherein the first transition of the second input signal is delayed from the first transition of the first signal in a first state of a lag condition of the first and second input signals;
      an first interpolator cell output coupled to an output of the first inverter and an output of the second inverter, the first interpolator output configured to provide an output signal interpolated from the first input signal and the second input signal; and
   first selection logic coupled to the first interpolator cell, the first selection logic configured to:
      enable a first transistor circuit of the first inverter in response to the first transition of the first input signal,
      to enable a first transistor circuit of the second inverter in response to the first transition of the second input signal; and
      to disable the first transistor circuit of the first inverter and the first transistor circuit of the second inverter prior to a subsequent transition of either the first input signal or the second input signal to prevent contention between the first inverter and the second inverter.

2. The interpolator of claim 1, wherein the first selection logic is configured to disable the first transistor circuit of the first inverter after the first transition of the second input signal and prior to a subsequent transition of either the first input signal or the second input signal to prevent contention between the first inverter and the second inverter.

3. The interpolator of claim 2, wherein each inverter of the first and second inverters includes:
   a pull-up transistor circuit including a first pull-up transistor and a second pull-up transistor coupled in series, wherein the first pull-up transistor is configured to receive the corresponding input signal of the first and second input signals and the second pull-up transistor is configured to receive a first selection signal and a third selection signal from a plurality of selection signals provided by the first selection logic; and a pull-down transistor circuit including first and second pull-down transistors coupled in series, wherein the first pull-down transistor is configured to receive the corresponding input signal of the first and second input signals and the second pull-down transistor is configured to receive a second selection signal or a fourth selection signal from the plurality of selection signals provided by the first selection logic.

4. The interpolator of claim 3, wherein the selection logic is configured to receive interpolation command information ($Sel_i$) for the first interpolation cell and feedback information including a state of the first interpolator cell output (OUT) and to provide the plurality of selection signals ($S_1{}^n$) including:

the first selection signal ($S_1{}^1$);
the second selection signal ($S_1{}^2$);
the third selection signal ($S_1{}^3$)); and
the fourth selection signal ($S_1{}^4$);
wherein each state of the plurality of selection signals is given by:

$(S_i{}^1) = \overline{Sel_i} + \overline{OUT}$, $(S_i{}^2) = Sel_i \cdot \overline{OUT}$, $(S_i{}^3) = Sel_i + \overline{OUT}$, and $(S_i{}^4) = \overline{Sel_i} \cdot \overline{OUT}$.

5. The interpolator of claim 1, including a first retention cell configured to retain a state of the first interpolator cell output in between the first transition of the second input signal and an immediately subsequent transition of either the first input signal or the second input signal.

6. The interpolator of claim 5, including second selection logic configured to disable the first retention cell in response to the first transition of the first input signal and to enable the first retention cell after the first transition of the second input signal.

7. The interpolator of claim 5, wherein the second selection logic is configured to receive an indication of the lag condition of the first and second input signals and to enable the first retention cell after the first transition of the second input signal using the indication.

8. The interpolator of claim 5, wherein the first retention cell includes:

a third inverter responsive to a state of the first input signal; and
a fourth inverter responsive to a state of the second input signal.

9. The interpolator of claim 8, wherein the second selection logic is configured to receive an indication of the lag condition of the first and second input signals and to provide retention control signals to the third and fourth inverters of the first retention cell.

10. The interpolator of claim 9, wherein each inverter of the third and fourth inverters includes:

a pull-up transistor circuit including first and second pull-up transistors coupled in series, wherein the first pull-up transistor is configured to receive the corresponding input signal of the first and second input signals and the second pull-up transistor is configured to receive a first retention selection signal and a third retention selection signal from a plurality of retention selection signals provided by the second selection logic; and a pull-down transistor circuit including first and second pull-down transistors coupled in series, wherein the first pull-down transistor is configured to receive the corresponding input signal of the first and second input signals and the second pull-down transistor is configured to receive a second retention selection signal or a fourth retention selection signal from the plurality of retention selection signals provided by the second selection logic.

11. The interpolator of claim 10, wherein the second selection logic is configured to receive feed-forward interpolation information ($b_{M+1}$) indicative of the lag condition of the first and second input signals and feedback information including a state of the first interpolator cell output (OUT), and to provide the plurality of retention selection signals ($R_1{}^n$) including:

the first retention selection signal ($R_1{}^1$);
the second retention selection signal ($R_1{}^2$);
the third retention selection signal ($R_1{}^3$); and
the fourth retention selection signal ($R_1{}^4$);
wherein each state of the plurality of retention selection signals is given by:

$(R_i{}^1) = b_{M+1} + \overline{OUT}$, $(R_i{}^2) = \overline{b_{M+1}} \cdot \overline{OUT}$, $(R_i{}^3) = \overline{b_{M+1}} + \overline{OUT}$, and $(R_i{}^4) = b_{M+1} \cdot \overline{OUT}$, and wherein $b_{M+1}$ is representative of a control bit of a delay stage preceding the interpolator.

12. A method of interpolating a first input signal and a second input signal to provide an interpolated output signal at an output of an interpolator, the method comprising:

receiving a first transition of the first input signal at a first inverter of a first interpolation cell of the interpolator;
receiving a first transition of the second input signal at a second inverter of the first interpolation cell, wherein the first transition of the second input signal is delayed from the first transition of the first input signal in a first state of a lag condition of the first and second input signals;
receiving a plurality of selection signals at control nodes of the first and second inverters from a first selection logic;
providing an interpolated signal at an output of the interpolator using the selection signals, an output of the first inverter, and an output of the second inverter; wherein providing the interpolated signal includes:
  enabling a first portion of the first inverter in response to the first transition of the first input signal using the plurality of selection signals, the output of first inverter coupled to an output of the first interpolator cell;
  enabling a first portion of a second inverter in response to the first transition of the second input signal using the plurality of selection signals, the output of the second inverter coupled to the output of the first interpolator cell; and
  disabling the first portion of the second inverter a delay interval after receiving the first transition of the second input signal using the plurality of selection signals to prevent contention between the first inverter and the second inverter; and
wherein the output of the first interpolator cell is coupled to the output of the interpolator.

13. The method of claim 12, including disabling the first transistor circuit of the first inverter after the first transition of the second input signal and prior to a subsequent transition of the first input signal using the plurality of selection signals.

14. The method of claim 13, including providing the plurality of selection signals from the first selection logic, wherein the providing the plurality of selection signals includes:
   receiving interpolation command information ($Sel_i$) for the first interpolation cell at the first selection logic; and
   receiving a state of the output (OUT) of the interpolator at the first selection logic.

15. The method of claim 14, wherein the providing the plurality of selection signals includes:
   providing a first selection signal ($S_1^1$) of the plurality of selection signals, wherein a state of the first selection signal is given by:

$(S_i^1) = \overline{Sel_i} + \overline{OUT}$;

providing a second selection signal ($S_1^2$) of the plurality of selection signals, wherein a state of the first selection signal is given by:

$(S_i^2) = \overline{Sel_i} \cdot \overline{OUT}$;

providing a third selection signal ($S_1^3$) of the plurality of selection signals, wherein a state of the third selection signal is given by:

$(S_i^3) = \overline{Sel_i} + \overline{OUT}$; and providing a fourth selection signal ($S_1^4$) of the plurality of selection signals, wherein a state of the fourth selection signal is given by:

$(S_i^4) = \overline{Sel_i} \cdot \overline{OUT}$.

16. The method of claim 12, including retaining a state of the output of the first interpolator cell during an interval in between the first transition of the second input signal and an immediately subsequent transition of either the first input signal or the second input signal using an output of a first retention cell of the interpolator and a plurality of retention selection signals provided by second selection logic.

17. The method of claim 16, including disabling the first retention cell in response to the first transition of the first input signal using the second selection logic; and
   enabling the first retention cell after the first transition of the second input signal using the second selection logic.

18. The method of claim 17, wherein enabling the first retention cell includes:
   receiving feed-forward interpolation information ($b_{M+1}$) indicative of the lag condition of the first and second input signals at the second logic;
   receiving feedback information including a state of the first interpolator output (OUT); and
   providing the plurality of retention selection signals ($R_1''$) to the first retention cell.

19. The method of claim 18, wherein the providing the plurality of retention selection signals ($R_1''$) includes:
   providing a first retention selection signal ($R_1^1$) to a first control node of a third inverter of the retention cell, wherein a state of the first retention signal is given by:

$(R_1^1) = b_{M+1} + \text{OUT}$;

providing a second retention selection signal ($R_1^2$) to a second control node of the third inverter of the retention cell, wherein a state of the second retention signal is given by:

$(R_1^2) = \overline{b_{M+1}} \cdot \text{OUT}$;

providing a third retention selection signal ($R_1^3$) to a first control node of a fourth inverter of the retention cell, wherein a state of the third retention signal is given by:

$(R_1^3) = \overline{b_{M+1}} + \text{OUT}$;

providing a fourth retention selection signal ($R_1^4$) to a second control node of the fourth inverter of the retention cell, wherein a state of the fourth retention signal is given by:

$(R_1^4) = b_{M+1} \cdot \text{OUT}$, and wherein $b_{M+1}$ is representative of a control bit of a delay stage preceding the interpolator.

* * * * *